(12) United States Patent
Schweikert et al.

(10) Patent No.: US 7,470,904 B1
(45) Date of Patent: Dec. 30, 2008

(54) INFRARED CAMERA PACKAGING

(75) Inventors: Paul Schweikert, Lompoc, CA (US);
William J. Parrish, Santa Barbara, CA (US); Andrew Sharpe, Solvang, CA (US); Vu L. Nguyen, Goleta, CA (US); Marco Scussat, Santa Barbara, CA (US)

(73) Assignee: Flir Systems, Inc., Wilsonville, OR (US)

( * ) Notice: Subject to any disclaimer, the term of this patent is extended or adjusted under 35 U.S.C. 154(b) by 74 days.

(21) Appl. No.: 11/385,007

(22) Filed: Mar. 20, 2006
(Under 37 CFR 1.47)

(51) Int. Cl.
*H01L 23/02* (2006.01)
*G01J 5/00* (2006.01)

(52) U.S. Cl. .................... 250/338.1; 257/680; 257/682; 438/106

(58) Field of Classification Search ............. 250/338.1; 438/57, 58, 106, 116; 257/680, 682
See application file for complete search history.

(56) References Cited

U.S. PATENT DOCUMENTS

| | | | |
|---|---|---|---|
| 5,433,639 A | 7/1995 | Zahuta et al. | |
| 5,550,398 A * | 8/1996 | Kocian et al. | 257/434 |
| 6,499,354 B1 | 12/2002 | Najafi et al. | |
| 6,686,653 B2 * | 2/2004 | Jerominek et al. | 257/680 |
| 7,385,199 B2 | 6/2008 | DeWames et al. | |

OTHER PUBLICATIONS

Premachandran et al.; "Vacuum Packaging Development And Testing For An Uncooled IR Bolometer Device."; 2004 Electronic Components and Technology Conference; Electronic Components and Technology Conference, 2004; vol. 1, pp. 951-955; Jun. 2004.*

Loral, Phase II Government / Industry Briefing, Staring Dewar Mantech Program, Nov. 1995 (110 pages).

Air Force Research Laboratory, AFRL-IF-RS-TR-2002-277 Final Technical Report, Raytheon Company, Vacuum Packaging for Microelectromechanical Systems (MEMS), Oct. 2002 (70 pages).

Tilmans et al.; "The Indent Reflow Sealing (IRS) Technique . . . "; Journal of Microelectromechanical Systems; vol. 9; pp. 206-217; Jun. 2000.

* cited by examiner

*Primary Examiner*—David P Porta
*Assistant Examiner*—Mark R Gaworecki
(74) *Attorney, Agent, or Firm*—MacPherson Kwok Chen & Heid LLP; Greg J. Michelson

(57) ABSTRACT

Systems and methods for providing a sealed container having a reduced pressure atmosphere are disclosed. The container is suitable for housing an infrared detector array. Outgassing can be enhanced by adding features to solder preforms that maintain pathways for gasses to more readily exit the container prior to sealing thereof. Getters can be used to mitigate undesirable gases within the sealed container. One or more bolometers can be used to determine if the sealed container is leaking. A vacuum positioning fixture can be used to assemble the components of the infrared detector assembly and to place the infrared detector assemblies into a vacuum chamber. The cost of manufacturing such infrared detector assemblies may be reduced and the reliability thereof enhanced.

38 Claims, 8 Drawing Sheets

INFRARED CAMERA PACKAGING

TECHNICAL FIELD

The present invention relates generally to electronics packaging and, more particularly, to systems and methods suitable for packaging infrared detectors and other electronic devices.

BACKGROUND

Some electronic devices may operate in a reduced pressure atmosphere, e.g., a vacuum, or in an inert gas atmosphere. Examples of such devices include infrared sensors, vacuum tubes, and vacuum transistors, which are typically hermetically sealed within glass or metal containers to maintain the desired atmosphere.

Bolometers are one type of infrared sensor that operates in a reduced pressure atmosphere. A bolometer is a detector that changes resistance in response to incident radiant energy. A bolometer can thus be used to measure the amount of heat radiated from an object. An array of bolometers, such as in a focal plane array (FPA), may be used to facilitate infrared imaging.

The array of bolometers can be enclosed within a hermetically sealed container to provide heat isolation. In this manner, sources of heat other than the radiant energy intentionally being measured are mitigated so as to enhance the quality of images provided by the detectors. The array of bolometers is positioned behind a window of the hermetically sealed container to permit communication of the radiant energy thereto.

Although contemporary methods for fabricating hermetically sealed structures for such electronic devices have proven generally suitable for their intended purpose, they do possess inherent deficiencies that tend to detract from their overall desirability. For example, contemporary methods for sealing such containers often involve the use of a pinch tube. The pinch tube is used to evacuate and/or backfill the container. Once the desired atmosphere is established within the container, the pinch tube is pinched off and sealed. Pinching off the tube generally involved crimping the tube closed and cutting the tube at the crimp.

Such sealing via the use of a pinch tube must be accomplished in a manner that tends to maintain the desired atmosphere within the container. There are costs (both labor and materials) associated with performing the pinching process and there is also a failure rate (such as due to subsequent leakage of the pinch tube) associated therewith. Consequently, it is desirable to provide a less costly and more reliable process for evacuating, backfilling, and/or sealing such containers.

SUMMARY

Systems and methods for providing a sealed container having a reduced pressure atmosphere are disclosed. The container is suitable for housing, for example, an infrared detector array. Such containers are frequently outgassed as a part of the evacuation process, using a known process involving heating an item for a period of time in a reduced pressure atmosphere, so as to remove gasses that may otherwise be present after evacuation.

Outgassing can be enhanced by adding features to solder preforms that maintain effective pathways for gasses to exit the container prior to sealing the container. Getters can also be used to further mitigate undesirable gases within the container after it is sealed. Furthermore, one or more bolometers can be used to determine if the sealed container is leaking. For assembly, in accordance with one or more embodiments of the present invention, a vacuum positioning fixture can be used to assemble the components of a plurality of infrared detector assemblies and to place the infrared detector assemblies into a vacuum chamber or other processing device.

More particularly, according to one embodiment of the present invention, an unsealed container comprises a first section of a container, a second section of the container configured to mate to the first section, and a first solder preform configured to attach the first section to the second section upon sufficient heating. The first solder preform can have at least one feature that is configured to maintain the first section spaced apart from the second section during outgassing.

For example, the feature can comprise a dimple. Alternatively, the feature can comprise any other structure that maintains the two adjacent structures that are to be sealed together in a spaced apart configuration that enhances venting during outgassing and subsequently facilitates sealing thereof.

A window can be configured to seal to the first section of the container. The window can be transmissive to a desired section of the electromagnetic spectrum, such as infrared, so as to communicate electromagnetic radiation to a sensor or the like within the container. Thus, an infrared sensor array can be disposed within the container.

A second solder preform can be configured to seal the window to the first section upon heating. Like the first solder preform, the second solder preform can have at least one feature that is configured to maintain the window spaced apart from the first section to enhance venting during outgassing.

Either the first housing section or the second section can comprise a ceramic material having at least one metal trace formed thereon. In this manner, the contemporary need for through pins (conductive pins that pass through a wall of the container to facilitate electrical communication) is eliminated. The ceramic material can be layered such that metal traces are formed intermediate two ceramic layers.

Thus, according to one embodiment of the present invention, a sealed container can be fabricated by placing a first solder preform between a first section of a container and a second section of the container and then heating the solder so as to seal the first section to the second section. The first solder preform can have at least one feature formed therein so as to maintain the first housing section spaced apart from the second section prior to heating the solder sufficiently to melt it.

The container can be heated so as to facilitate outgassing without heating the solder sufficiently so as to cause it to melt. Typically, outgassing will be performed at a temperature that is close to the melting point of the solder, but is low enough to inhibit such melting.

An infrared detector assembly can be fabricated by placing an array of bolometers within the container prior to sealing, with the bolometers receiving infrared radiation through the window. Furthermore, a getter can be disposed within the sealed container and can be fired so as to enhance the vacuum within the sealed container (e.g., remove gasses from sealed environments according to well know principles). One or more bolometers can be used to determine if the housing or container is not sealed properly (e.g., has a gas leak) or has otherwise experienced vacuum degradation (such as due to excessive latent outgassing within the sealed container).

Vacuum degradation can have three causes. It can be caused by leakage of gases, such as ambient air, into the container. It can be caused by one or more gas bubbles trapped (such as within an epoxy component or a ceramic component) within the container that release gas over time. It can be caused by contamination that outgases over time (such as contamination introduced by improper processing).

For example, the infrared detector assembly can be placed in a pressurized helium environment and a bolometer measurement then compared to a previous bolometer measurement (e.g., prior to placing the infrared detector assembly in the pressurized helium environment), which for example may be performed using a calibrated infrared light source for both measurements. As those skilled in the art will appreciate, the presence of gasses within the sealed container can adversely affect the ability of a bolometer to measure infrared radiation (this is the reason for placing the bolometer in an evacuated enclosure).

Responsivity of the bolometers can be checked before and after activating the getters, as well as before and after helium bombing. Earlier responsivity checks can serve as baselines for determining the results of later responsivity checks. Excessive degradation can be indicated when a predetermined responsivity of the bolometers is measured. The predetermined responsivity can be that which has been determined to indicated poor response of the infrared detector assembly and/or reduced life thereof.

According to one embodiment, the present invention comprises a fixture for assembling and handling infrared detector assemblies. The fixture can comprise a plurality of cells that are configured to contain a corresponding plurality of infrared detector assemblies in an unsealed configuration and to maintain a desired relationship of the components relative to one another.

A vacuum source can be used for applying vacuum to the cells such that the infrared detector assemblies are held therein when the fixture is inverted. Thus, the positioning fixture can be inverted so as to place unsealed infrared detector assemblies upon a process plate for outgassing, sealing, and/or leak testing.

A gravity plunger can be provided for each cell. The gravity plungers can be configured so as to urge the infrared detector assemblies from each cell when the fixture is inverted and vacuum is discontinued.

According to one embodiment of the present invention, a method for processing an infrared detector assembly can comprise heating the infrared detector assembly in a vacuum to effect outgassing thereof, increasing the heat to effect sealing of the infrared detector assembly, cooling the infrared detector assembly, leak checking the infrared detector assembly with pressurized helium; and using a bolometer of the infrared detector assembly to determine if the infrared detector assembly is leaking.

More particularly, for a specific implementation example in accordance with an embodiment of the present invention, heating the infrared detector assembly in a vacuum can comprise heating the infrared detector assembly to 171° C. (or just below the solder melting temperature) for approximately 6-18 hours, for example, and at a pressure of approximately $5 \times 10^{-6}$ torr; increasing the heat to effect sealing of the infrared detector assembly can comprise increasing the temperature of the infrared detector assembly to approximately 235° C. (or approximately 25° C. to 40° C. above the solder melting temperature) for approximately 3 minutes and 40 seconds; cooling the infrared detector assembly can comprise cooling the infrared detector assembly to approximately ambient temperature; and leak checking the infrared detector assembly with pressurized helium can comprise leak checking the infrared detector assembly with helium at a pressure of approximately 60 psi.

The cost of manufacturing such infrared detector assemblies may be reduced and the reliability thereof enhanced. For example, the cost of manufacturing may be reduced, at least in part, because the use of a pinch tube is eliminated. Furthermore, for example, the reliability may be increased, at least in part, because failures due to leakage of the pinch tube are likewise eliminated.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Embodiments of the present invention and their advantages are best understood by referring to the detailed description

DETAILED DESCRIPTION

Figure 1:
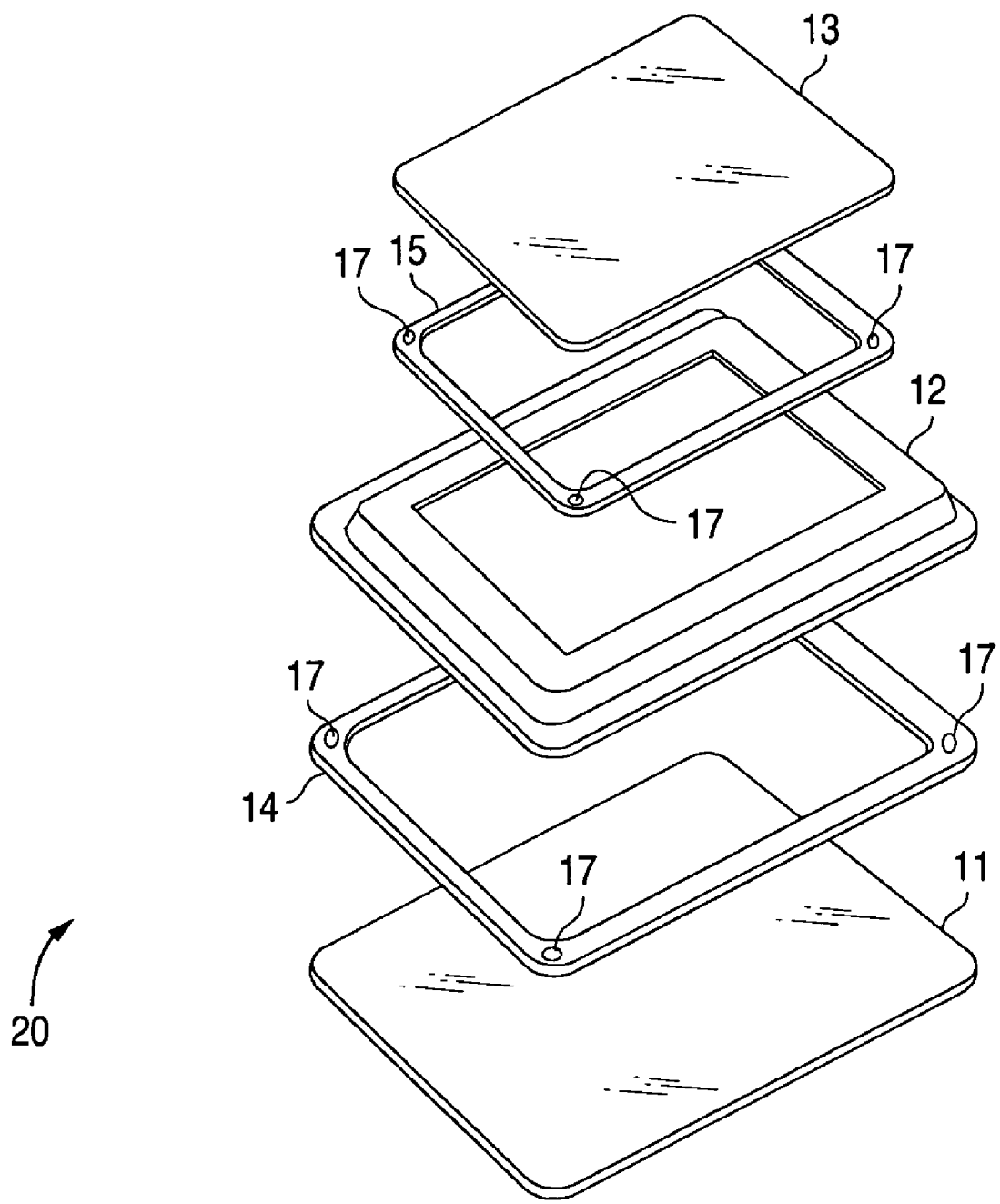
FIG. 1 shows an exploded perspective view illustrating a sealable container prior to sealing thereof, in accordance with an exemplary embodiment of the present invention.

FIG. 1 shows an exploded perspective view of a controlled atmosphere container 20 according to one aspect of the present invention. Controlled atmosphere container 20 can be used to provide a reduced pressure environment or an inert gas environment, such as is desired for some electronic, optical, electro-optical and other devices. For example, controlled atmosphere container 20 can provide a vacuum (which can be defined herein as substantially reduced air pressure) for an infrared detector array (such as an array of bolometers).

Controlled atmosphere container 20 can comprise a lower housing section 11 to which an upper housing section 12 is hermetically sealed. Upper housing section 12 can be formed of any suitable material. For example, upper housing section 12 can be formed of stamped Kovar, such as 0.015 inch thick sheet Kovar. Upper housing section 12 can be also plated for enhanced solderability and corrosion protection. For example, upper housing section 12 can be plated with electrolytic nickel and/or electrolytic gold.

Lower housing section 11 can be formed of a ceramic material, as discussed below. Alternatively, lower housing section 11 can be formed of the same material as upper housing section 12 or of any other suitable material.

A window 13 can be hermetically sealed to upper housing section 12. Window 13 can be infrared transparent and can thus facilitate the communication of infrared radiation to an infrared detector array disposed within controlled atmosphere container 20, for example. Window 13 can be formed of float zone silicon. Alternatively, window 13 can be formed of other materials, such as germanium. Window 13 can have one or more anti-reflection coatings formed thereon.

A lower solder preform 14 can be used to seal upper housing section 12 to lower housing section 11. Lower solder preform 14 can be disposed intermediate upper housing section 12 and lower housing section 11 in a sandwich like fashion. Solder preform 14 (along with upper housing section 12 and lower housing section 11) can be heated such that solder preform 14 melts and seals upper housing section 12 to lower housing section 11. Such heating can be preformed in a controlled atmosphere, such as within a vacuum chamber, for example. In this manner, the controlled atmosphere is substantially maintained within container 20 during and (absent leakage) after the sealing process.

Window 13 can be sealed to upper housing section 12 in a like manner. Indeed, any desired number or combination of container sections can be sealed to one another in this fashion or in any other desired fashion.

At least one feature, such as dimple 17 in accordance with an embodiment of the present invention, can be formed in a solder preform (such as lower solder preform 14 or upper solder preform 15) so as to space adjacent items to be sealed apart from one another. For example, four dimples 17 can be used to space upper housing section 12 apart from lower housing section 11 and similarly four dimples 17 can be used to space window 13 apart from upper housing section 12. Any desired number of dimples 17 or other features can be used to space apart adjacent items. The features can facilitate enhanced evacuation and outgassing processes.

Upper solder preform 15 can have features such as dimples 17 and lower solder preform 14 can lack such features. Alternatively, lower solder preform 14 can have features such as dimples 17 and upper solder preform 15 can lack such features. As a further alternative, both lower solder preform 14 and upper solder preform 15 can have such features. According to one embodiment of the present invention, at least one solder preform has one or more of such features.

When the temperature of the preform(s) is raised sufficiently so as to effect sealing, then the solder melts and the features, e.g., dimples, flow and substantially so as to lose their form. They no longer maintain spacing of the adjacent components (such as the upper housing section 12 and the lower housing section 11 or such as the window 13 and the upper housing section 12). Rather, the melted features flow so as to allow the adjacent components to move toward one another and seal in a manner that is substantially identically to the manner that the components would seal to one another if such features were absent. Thus, the solder preforms of the present invention facilitate both enhanced outgassing and desired sealing.

Alternatively, the solder preform can be configured in any other manner so as to space the adjacent items to be sealed apart from one another. For example, one or more corners of a rectangular preform can be bent or turned upward, so as to provide such spacing. Indeed, many such alterations of a generally flat preform will result in the formation of features that effect such spacing. Providing raised features or bends in such a preform will generally effect such spacing.

Such spacing apart of these items tends to maintain gaps therebetween prior to heating sufficiently to melt the solder preform. Thus, gases within the container can more easily escape and/or be replaced with desired gases prior to sealing. This includes gases that outgas from the container or its contents due to a reduced pressure/heated environment.

Once the desired atmosphere is established within the container and/or any desired outgassing is completed, then the solder preform(s) can be further heated so as to seal the container and thereby maintain the desired atmosphere. This second level of heating is to a higher temperature than the heating required for outgassing, such that the higher temperature is sufficient to melt the solder preform(s).

Figure 2:
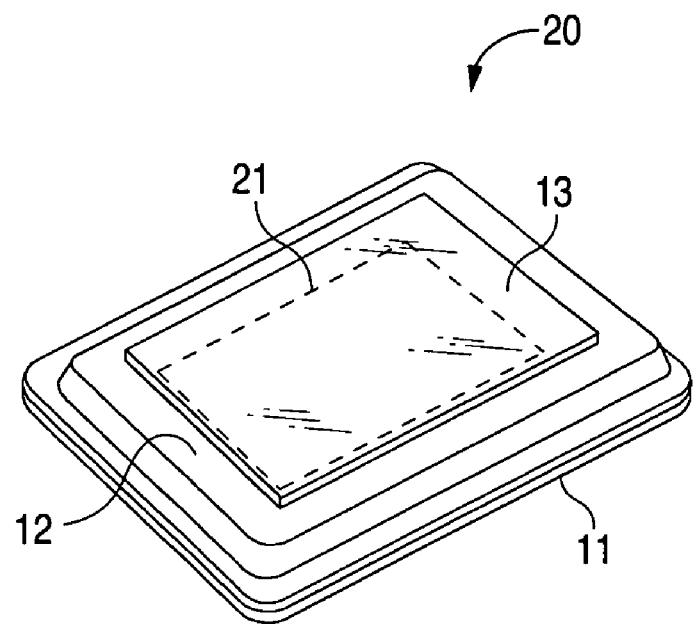
FIG. 2 shows a perspective view illustrating the container of FIG. 1 after sealing, in accordance with an exemplary embodiment of the present invention.

FIG. 2 shows the controlled atmosphere container 20 of FIG. 1 after the sealing process. Upper housing section 12 has been sealed to lower housing section 11 and window 13 has been sealed to upper housing section 12. An infrared detector array 21, for example, can be disposed within sealed container 20. Alternatively, any other item can be disposed within sealed container 20.

Electrical communication between infrared detector array 20 and circuitry outside of the container can be facilitated by electric conduits, e.g., metal traces, that extend through a ceramic lower housing section 11 of container 20, as discussed in detail below.

Figure 3:
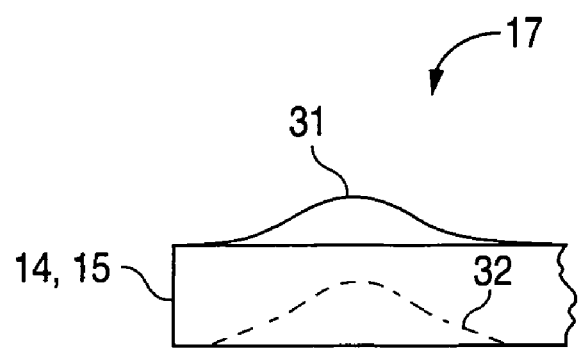
FIG. 3 shows a fragmentary side view illustrating a dimple formed in a solder preform in accordance with an exemplary embodiment of the present invention.

FIG. 3 shows a side view of an exemplary dimple 17, such as those formed in solder preforms 14 and 15. Dimple 17 can have a convex surface 31 and a concave surface 32. Dimples 17 of solder preforms 14 and 15 can be formed using a punch or similar tool. That is, a punch or similar tool can be forced into a solder preform so as to form the convex 31 and concave 32 surfaces.

Alternatively, dimples 17 can be pressed into solder preforms, such as with plates (such as in a metal stamping process) having complimentary concave and convex surfaces or with rollers having such complimentary surfaces formed thereon. As a further alternative, dimples 17 can be formed in solder preforms when the solder preforms are originally molded (such as in a pair of mold cavities having complimentary concave and convex surfaces formed therein).

Dimples 17 need not be generally round in configuration. Rather, they may have any other desired shape. As such, dimples 17 can be generally square, rectangular, triangular, or oval in shape, for example.

Solder can be indium/lead solder having proportions of approximately 60% indium and approximately 40% lead, by weight. However, as used herein, the term solder is not limited to indium/lead solder. The solder can comprise other substances, such as gold, silver, platinum, copper, bismuth, and tin. Indeed, the term solder can be used herein to refer to any substance or device that can effect the desired spacing of items to be sealed and then can seal the item when heat is applied. The melting temperature of the solder, for example, can be between 173° C. and 181° C.

Further, the term preform is not limited to a structure having a shape that generally approximates the shape of the solder after heating occurs to effect sealing. That is, the preform does not have to be formed in the pattern of the surfaces that it is intended to seal. Thus, the preform can have a substantially different shape before heating with respect to its shape after heating. Indeed, the preform need not be a single item. Rather, a plurality of items can define a preform. For example, the preform can be defined by a plurality of solder spheres. The solder spheres can be placed intermediate to two structures that are to be sealed to one another so as to maintain spacing therebetween. Upon heating, the solder spheres can flow so as to effect sealing. Columns of solder, solder wires, and various other solder structures or shapes can be similarly used to effect spacing and sealing.

Figure 4:
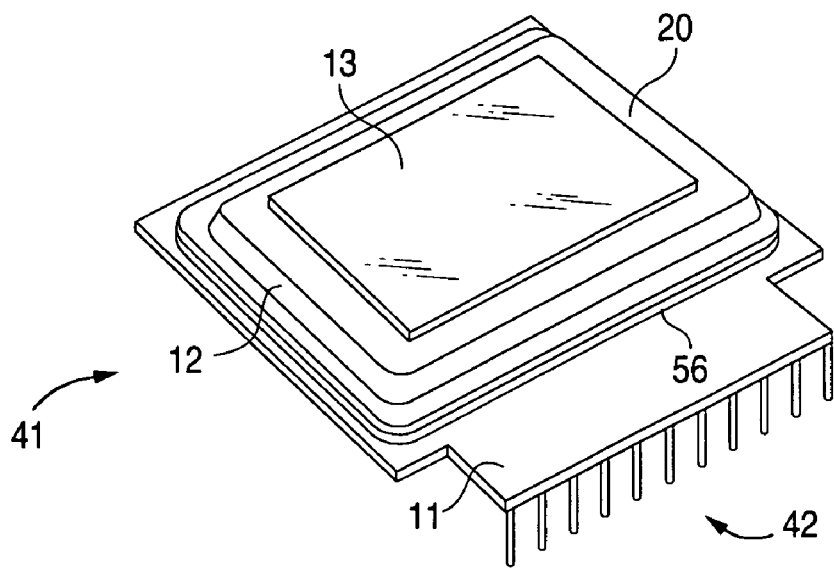
FIG. 4 shows a perspective view illustrating an infrared detector assembly, in accordance with an exemplary embodiment of the present invention.

FIG. 4 shows the sealed container 20 of FIG. 2 as it can be used to make an infrared sensor assembly 41. Sealed container 20 can be partially defined by a lower housing section 11 that extends away from upper housing section 12 and has a plurality of contact pins 42 attached to the extending portion thereof. Electrical communication with circuitry (e.g., an infrared sensor array) inside of container 20 can be facilitated via pins 42. Pins 42 can be received within a socket or connector, for example.

Figure 5:
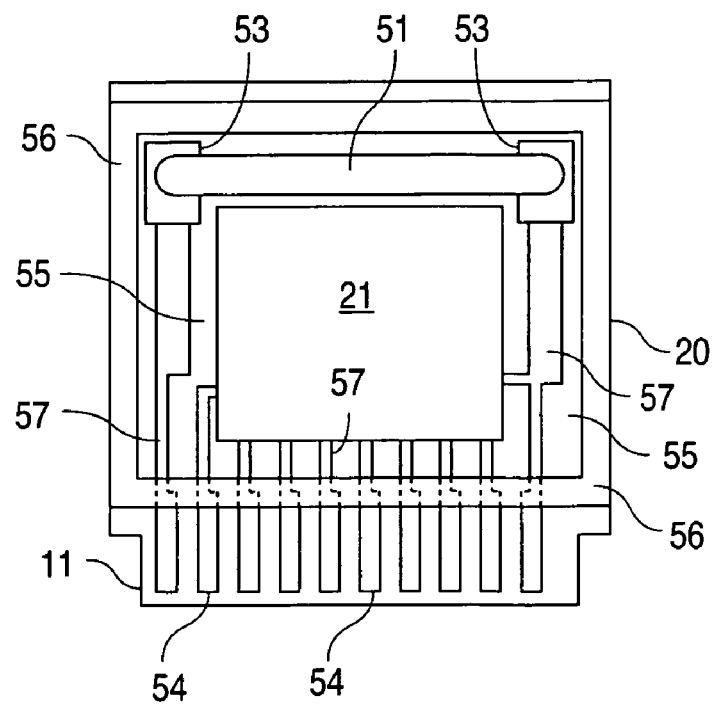
FIG. 5 shows a plan view illustrating the inside of the infrared detector assembly of FIG. 4.

FIG. 5 shows an optional getter 51 inside of container 20. Getter 51 can be used to remove undesirable gases from inside of container 20 after it has been sealed. Getter 51 extends between Kovar blocks 53 via which current can be communicated through getter 51. Getter 51 can be attached to Kovar blocks 53 by spot welding or brazing. Current applied to one or more pins 42 can be communicated via metal traces 57 to Kovar blocks 53.

Getter 51 can be used to remove oxygen and/or other gases from inside of sealed container 20, where such gases tend to adversely affect the performance of an infrared detector array 21. Thermal conduction (as can occur when gasses are present) can adversely affect the ability of bolometers to accurately measure radiant thermal energy. Thus, the presence of gasses within sealed container 20 can adversely affect infrared imaging.

Optionally, upper housing section 12 can be formed so as to define a heat shield that protects components within container 20 from heat during a getter activation process. For example, metal from the area of the window opening can be bent inwardly to define such a heat shield.

Lower housing section 11 can comprise an insulator, such as a ceramic material, e.g. alumina ceramic. Lower housing section 11 can define a surface 55 upon which metal traces 57 can be formed so as to provide electrical communication between pins 42 (which can contact metal traces 54 through vias formed in lower housing section 11) and infrared detector array 21, as well as between pins 42 and getter 51.

Metal traces 57 can be formed by a layer of molymanganese or tungsten, for example. Metal traces 57 can comprise electrolytic nickel, electrolytic gold, electrolytic copper, or immersion silver that are plated upon the layer of molymanganese or tungsten, for example.

Metal traces 57 can extend beneath an insulating ring 56, such as an insulating ring comprised of a ceramic material, e.g., alumina ceramic. Thus, metal traces 57 within container 20 can be in electrical communication with metal traces 54 outside of container 20.

Insulating ring 56 can be attached to lower housing section 11 by any desired means that does not adversely interfere with electrical communication via metal traces 54 and 55. For example, insulating ring 56 can be attached to lower housing section 11 by adhesive bonding, e.g., epoxy. Alternatively, insulating ring 56 can be fused to lower housing section 11 during a firing process, as discussed below.

Lower housing section 11 can comprise a plurality of layers, such as ceramic layers, to facilitate routing of metal traces 54 and 57, if desired. The ceramic layers can have metal traces formed therebetween and can have through vias to provide electrical communication between layers. Thus, a plurality of ceramic layers can be formed using semiconductor like manufacturing techniques (such as the use of vias) to route metal traces, as desired. In this manner, metal traces can extend between ceramic layers from the front to the rear of lower housing section 11 (and thus be insulated) and can also extend to the upper surface of lower housing section 11 through vias in the upper layer thereof, for example.

The ceramic layers can be fused to one another during a firing process. The temperature of the firing process will be a temperature that facilitates fusing while not causing substantial degradation to the metal traces.

Alternatively, lower housing section 11 can comprise a plurality of layers attached to one another via epoxy. In either case, vias formed in the layers can facilitate routing of metal traces 54 and 57. Insulating ring 56 can be considered an example of a ceramic layer that is fused to lower housing section 11.

Insulating ring 56 can be shaped similar to the shape of lower solder preform 14. Lower solder preform 14 can rest upon insulating ring 56 during the outgassing and sealing processes. Thus, lower solder preform 14 can seal upper housing section 12 to lower housing section 11 via insulating ring 56 of lower housing section 11, if desired.

Figure 6:
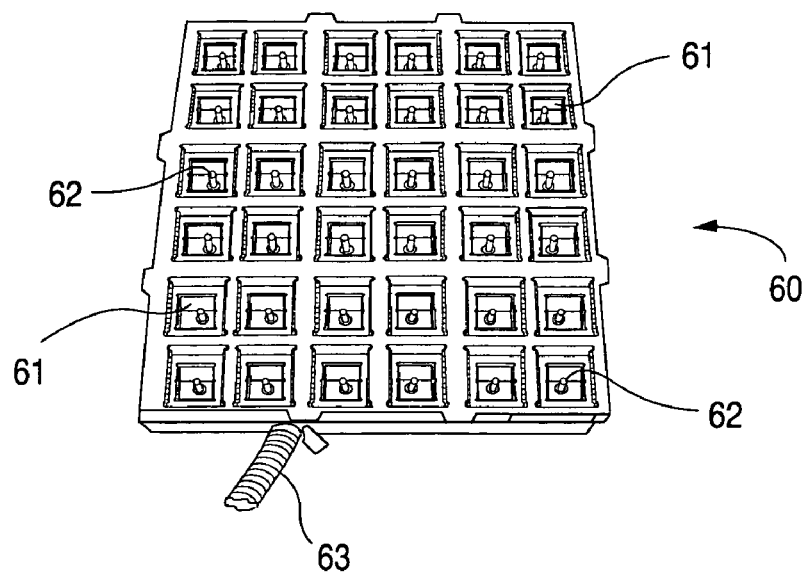
FIG. 6 shows a perspective view of a positioning fixture for positioning and holding parts of thirty-six infrared detector assemblies according to one embodiment of the present invention.
Figure 7:
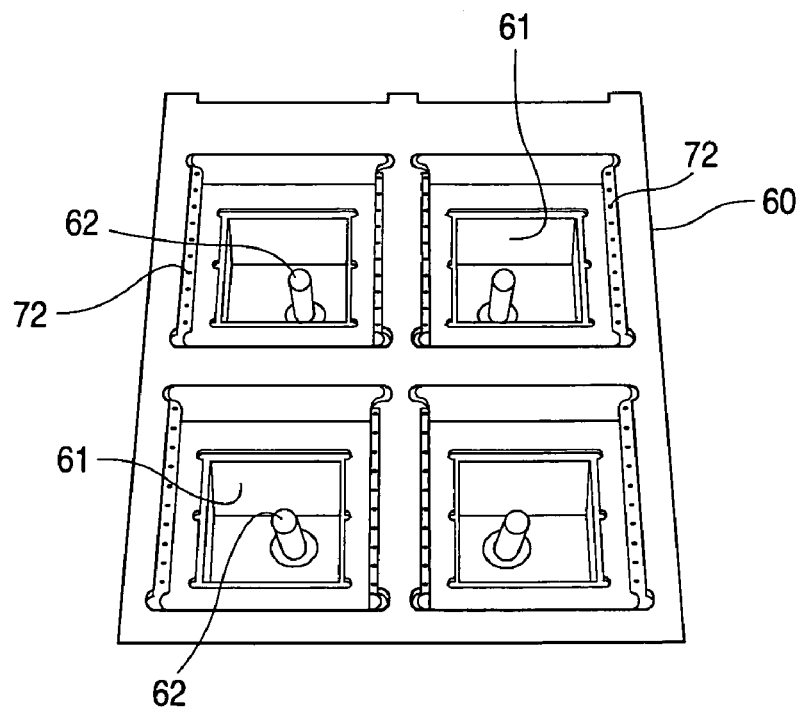
FIG. 7 shows an enlarged view of four cells of the positioning fixture of FIG. 6.

FIGS. 6 and 7 show perspective views of a vacuum powered positioning fixture 60 that can be used to position infrared detector assemblies 41 or the like upon or within a processing block 110 (FIGS. 11-13) or the like, such as where infrared detector assemblies 41 can be outgassed, sealed and/or otherwise processed. Positioning fixture 60 comprises a plurality of cells 61, with each cell 61 configured to receive the individual components of an unsealed container 20, such as that shown in FIG. 1, as well as the intended contents of the container, e.g., an infrared detector array. The components can be placed in cells 61 one item at a time to facilitate proper positioning, e.g., registration, thereof. That is, window 13, upper solder preform 15, upper housing section 12, lower solder preform 14, and lower housing section 11 can each, in turn, be placed into a cell 61 such that cell 61 holds these items approximately in their desire assembled positions.

Positioning fixture 60 of FIG. 6 is configured to have thirty-six cells 61. However, as those skilled in the art will appreciate, a positioning fixture can be configured to have other numbers of cells. For example, a position fixture can alternatively have one, four, nine, twenty-five, or any other desired number of cells.

Any desired contents of container 20 (such as an infrared detector array) can similarly be separately added to a cell 61. Alternatively, such contents can be added to a cell 61 when another item to which the contents are attached is added. For example, infrared detector array 21 can be attached to lower housing section 11, either directly or indirectly, and then be placed into a cell 61 when lower housing section 11 is placed into cell 61. Infrared detector array can be adhesively bonded to lower housing section 11.

Vacuum can be used to hold the contents of a cell 61, e.g., an unsealed container 20, within cell 61. In this manner, positioning fixture 60 can be moved or even inverted (turned upside down) without undesirably losing the contents of the cells 61. Thus, positioning fixture 60 can be used to flip over (such that the window is then uppermost) infrared detector assemblies contained therein. Infrared detector assemblies 41 can thus be flipped over and placed upon a process block 110, as described below.

Cells 61 can have plungers, such as gravity actuated plungers, that are configured to urge the contents of a cell 61 therefrom when the application of vacuum is discontinued for cells 61. Gravity actuated plungers 62 can be configured such that the weight of the plungers 62, or the weight of a structure attached to the plungers 62, causes plungers 62 to urge items contained within cells 61 therefrom when positioning fixture 60 is inverted and vacuum is discontinued. That is, the plungers 62 tend to push any items within cells 61 out of cells 61 when positioning fixture 60 is turned upside down and the vacuum is turned off.

Low friction plastic bushing inserts can be provided within each cell 61 to mitigate friction between one or more components of the infrared detector assembly and the walls of the cell 61. Examples of low friction plastic include Teflon, Delrin, and Rulon. Such mitigation of friction can better facilitate removal of the infrared detectors from cells 61. That is, the infrared detector assembly will more easily slide out of cells 61.

Vacuum can be applied to positioning fixture 60 via vacuum hose 63, which is in communication with apertures 22. Apertures 22 (FIG. 8) apply the vacuum to the contents of the cells 61 to hold the contents therein. The application of vacuum to positioning fixture 60 can be controlled by a switch that can be located on or near positioning fixture 60. The application of vacuum to positioning fixture 60 can be controlled by a footswitch, for example. The application of vacuum to positioning fixture 60 can alternatively be subject to automatic control.

Figure 8:
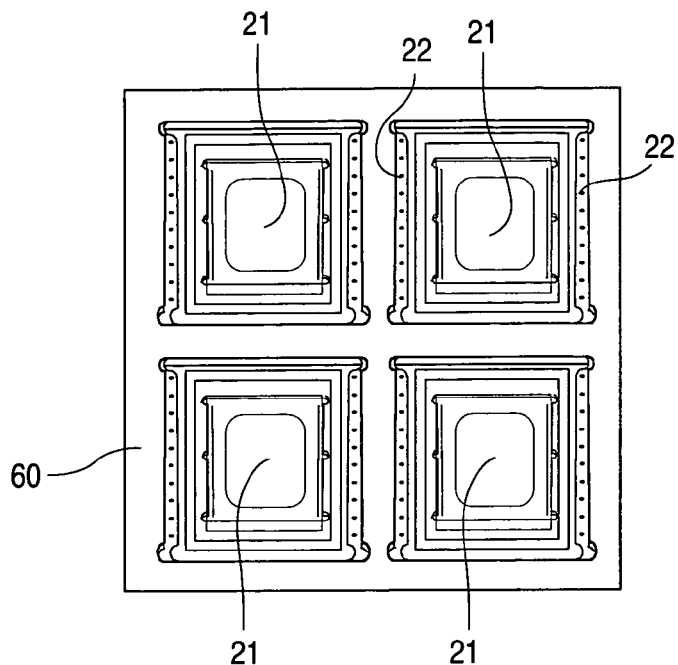
FIG. 8 shows the four cells of FIG. 7 having the windows disposed (in an inverted attitude) therein.

FIG. 8 shows four cells 61, each having a window 13 disposed therein. A first solder preform 15 can be disposed upon window 13 and then an upper housing section 12 can be placed thereon.

As mentioned above, apertures 22 facilitate the communication of vacuum to the contents of cells 61 so as to hold the contents of cells 61 therein. Apertures 22 can be in fluid communication with vacuum conduits that are formed in or attached to positioning fixture 60 and which facilitate communication of vacuum from vacuum hose 63 to cell 61.

Figure 9:
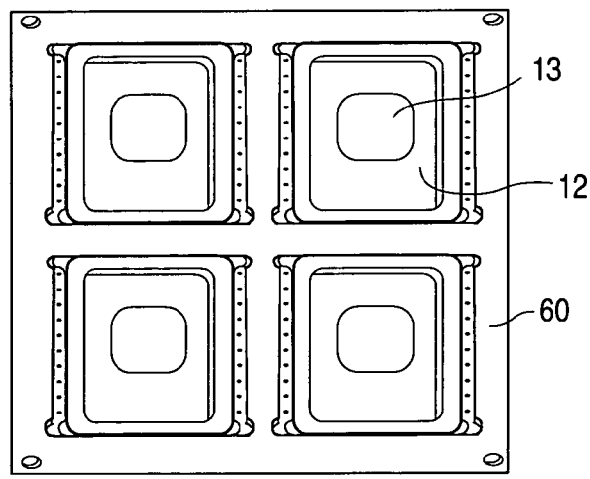
FIG. 9 shows the four cells of FIG. 8 having the windows and upper housing sections disposed therein.

FIG. 9 shows the four cells of FIG. 8 after first preform 15 and upper housing section 12 have been placed upon window 13. A second perform 14 and an infrared detector array 21 and any other desired items (such as getter 51) can next be placed inside of container 20, such as by adding a lower housing section 11 to which such items are attached.

Figure 10:
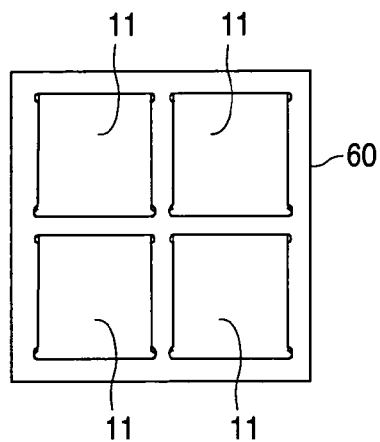
FIG. 10 shows the four cells of FIG. 9 having the lower housing sections placed atop the upper housing sections thereof.

FIG. 10 shows the four cells of FIG. 9 after a lower housing section 11 has been placed therein, along with a second perform and the other desired items. Cells 61 maintain desired alignment of the window 13, upper solder preform 15, upper housing section 12, infrared detector array 21, lower solder preform 14, and lower housing section 11 with respect to one another.

For example, cells 61 may be formed so as to have a plurality of levels, with each level supporting or holding in position one or more components. Vacuum outlets or ports 72 may be provided for each layer placed within cell 61 to securely hold the components of each layer in place. Alignment is maintained sufficiently so as to facilitate subsequent sealing of container 20 after the components have been removed from cells 61.

Optionally, some or all of the items placed within each cell 61 can be placed therein via automated or robotic equipment. For example, pick and place equipment can be used to place window 13, upper solder preform 15, upper housing section 12, infrared detector array 21, lower solder preform 14, and lower housing section 11 into cells 61.

Optionally, automated or robotic equipment can place some or all of the items directly upon the process block in their proper orientation with respect of each other.

Figure 11:
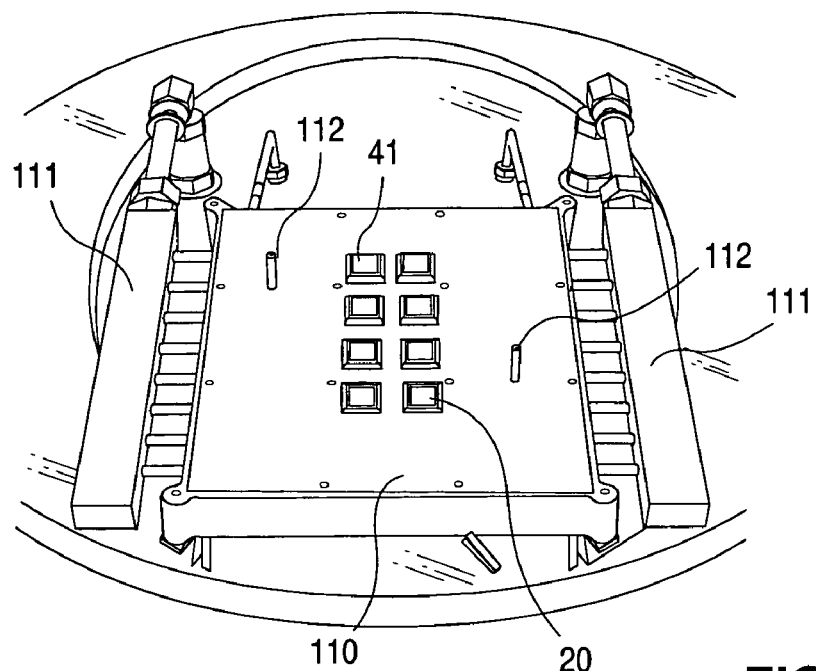
FIG. 11 shows a perspective view of a process block inside of a vacuum/heating chamber, wherein the process block has eight infrared detector assemblies placed thereon (such as via the use of the positioning fixture of FIGS. 6-10), so as to facilitate outgassing and sealing in accordance with an exemplary embodiment of the present invention.

FIG. 11 shows a process block 110 after eight unsealed infrared detector assemblies 41 have been placed thereon. Infrared detector assemblies 41 can be placed upon process block 110 in this fashion via the use of positioning fixture 60. Positioning fixture 60 keeps the parts of each infrared detector assembly 41 in alignment with one another as they are handled and placed upon process block 110 and also spaces each infrared detector assembly 41 with respect to each other infrared detector assembly 41 on process block 110.

To use positioning fixture 60 to place unsealed infrared detector assemblies 41 upon process block 110, the individual components of unsealed infrared detector assemblies 41 are placed within cells 61 of non-inverted positioning fixture 60. Positioning fixture 60 is then oriented in an inverted attitude above process block 110 with vacuum applied so as to keep unsealed infrared detector assemblies 41 within cells 61. Positioning fixture 60 can be lowered upon process block 110. Guide pins 112 of process block 110 can be received within corresponding guide pin holes of positioning fixture 60 to assured proper alignment of positioning fixture 60 with respect to process block 110.

When positioning fixture 60 is in contact with process block 110, infrared detector assemblies 41 will be in contact with process block 110 or approximately in contact with process block 110. When vacuum is discontinued, the components of each of infrared detector assemblies 41 maintain their alignment with respect to one another. Also, each infrared detector assembly 41 maintains its alignment with each other infrared detector assembly 41. Thus, unsealed infrared detector assemblies 41 can be placed upon process block 110 in a desired configuration simply by inverting positioning fixture 60 over process block 110, lowering positioning fixture 60 onto process block 110, and releasing the vacuum. Gravity actuated plungers 62 assure that all of the components of each infrared detector assembly are removed from each cell 61.

Cooling manifolds 111 provide a coolant, such as chilled water and/or air, to process plate 110, so as to effect rapid cooling of infrared detectors as discussed below. As those skilled in the art will appreciate, various fluid coolants, including air and/or water (e.g., sequentially), can be used.

Process blocks 110 can have heaters, such as electrical heaters, for heating infrared detector assemblies 41 during outgassing and sealing processes. Alternatively, such heating can be performed by flowing hot fluids through manifolds 111. Any desired combination of electrical heating and fluid heating can be used.

Figure 12:
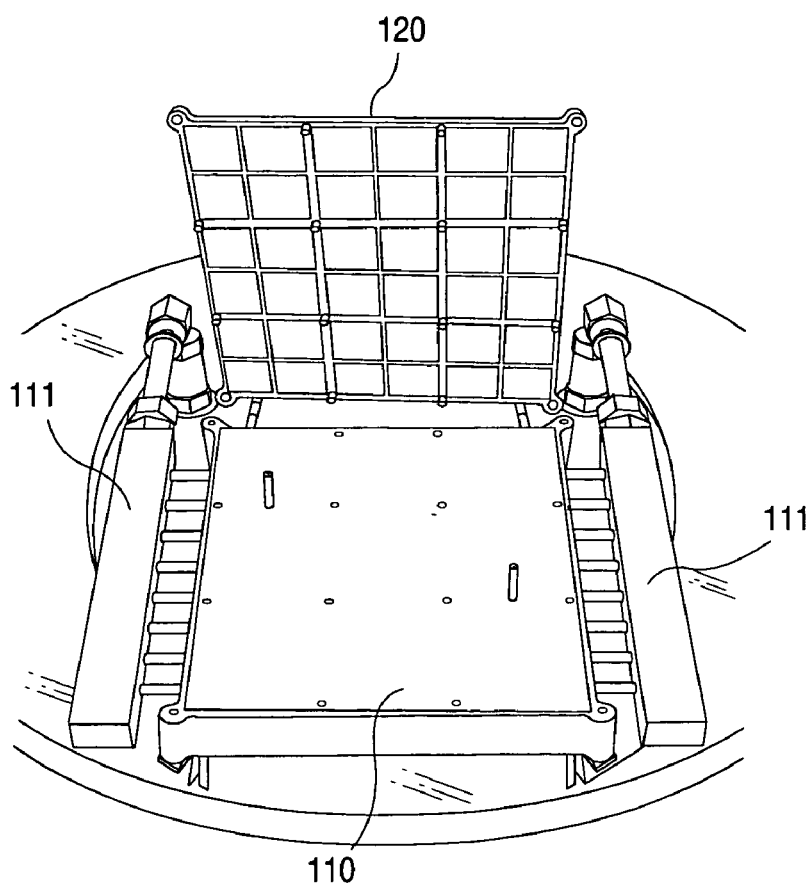
FIG. 12 shows a perspective view of the top of the process block, readied for attachment to the bottom thereof (as shown in FIG. 11), in accordance with an exemplary embodiment of the present invention.

FIG. 12 shows a lid 120 being attached to process block 110. Lid 120 inhibits undesirable movement of unsealed infrared detector assemblies 41. Once all of the infrared detector assemblies have been placed upon process block 110, then lid 120 can be attached thereto.

Figure 13:
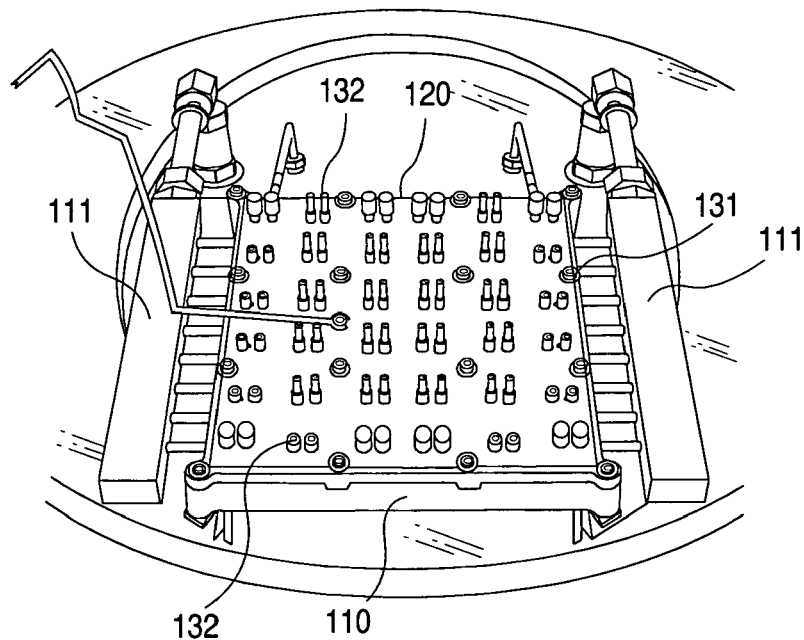
FIG. 13 shows the top and bottom of the process block of FIG. 12 attached to one another so as to facilitate outgassing and sealing of the infrared detector assemblies.

FIG. 13 shows lid 120 attached to process block 110. Lid 120 can be bolted to process block 110, such as via bolts 131. Alternatively, lid 120 can be removably attached to process block 110 by any other desired method.

Lid 120 can have push pins 132 for applying force to the components of infrared detector assembly 41 prior to sealing of container 20. As solder preforms 14 and 15 melt, components of container 20 (such as window 13, upper housing section 12, and lower housing section 11) tend to translate laterally and/or rotate. This movement is undesirable. The force applied by push pins 132 tends to hold the components of container 20 in their desired relative positions until the sealing process is complete. The use of two push pins for each container 20 tends to substantially inhibit rotation, as well as translation, of the components of container 20.

Push pins 132 can provide force due to the weight thereof. That is, they can be gravity actuated. Thus, push pins 132 can be weights that use gravity to apply force to the components of container 20. Alternatively, any other desired method for applying force can be used. For example, push pins 132 can be spring actuated.

Figure 14:
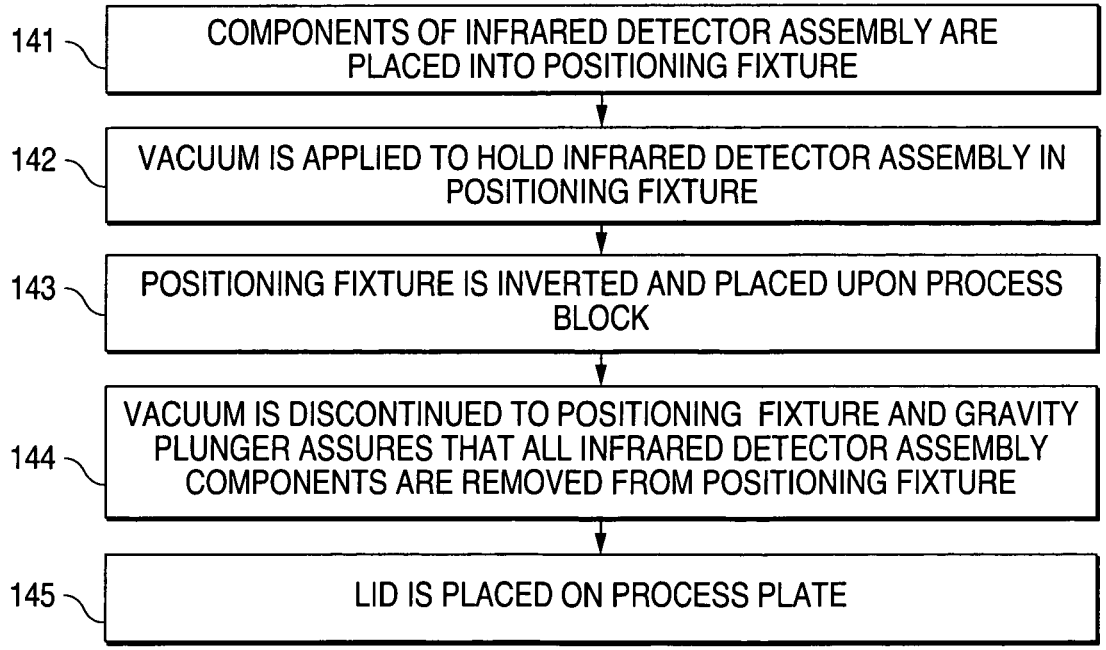
FIG. 14 is a flow chart showing a process for assembling components of an infrared detector assembly and for transferring the component to a process block for further processing, in accordance with an exemplary embodiment of the present invention.

FIG. 14 is a flow chart showing an exemplary process for assembling components of an infrared detector assembly and for transferring the component to a process block for further processing. According to this exemplary process, components of infrared detector assembly 41 are placed into positioning fixture 60, as indicated in block 141. This process can be repeated for a plurality of cells 61 of positioning fixture 60.

For example, window 13, upper solder preform 15, upper housing section 12, lower solder preform 14, lower housing section 11, and any desired contents of the container defined thereby are placed into a cell 61 of positioning fixture 60. In this exemplary embodiment of the present invention, the desired contents can include an infrared detector array 41, such as an array of bolometers (e.g., FPA). However, as those skilled in the art will appreciate, other items, including both electronic and non-electronic items, can be placed into positioning fixture 60 so as to be sealed within the container either in addition to or in place of the infrared detector array.

Vacuum is applied to positioning fixture 60, so as to hold the components placed therein in the cells, as indicated in block 142. As mentioned above, the application of vacuum permits positioning fixture 60 to be inverted without undesirably dropping or disturbing its contents.

Positioning fixture 60 can be moved from a location where the components are placed therein, such as upon a workbench, to another location, such as within a vacuum chamber. Within the vacuum chamber, positioning fixture 60 can be inverted and placed upon process block 110, as indicated in block 143. That is, positioning fixture 60 can be positioned such that the components within each cell 61 are placed within the vacuum chamber at desired locations for further processing and testing.

Vacuum can be discontinued to positioning fixture 60, as indicated in block 144. The components within each cell 61 can then separate from positioning fixture 60 and thus leave the components within cells 61 as positioning fixture 60 is picked up from process block 110 or removed from the vacuum chamber. Optionally, gravity plungers 62 of each cell 61 assure that the contents of each cell 61 are removed therefrom as positioning fixture 60 is picked up.

Handling of positioning fixture 60, such as transportation to and from the vacuum chamber, as well as placement upon and removal from process block 110, can be performed either manually or automatically. For example, such transport and handling can be accomplished by robotic or other automated systems.

Lid 120 can be placed upon process block 110, as indicated in block 145. Lid 120 assures that desired alignment of the components is maintained during further processing.

Figure 15:
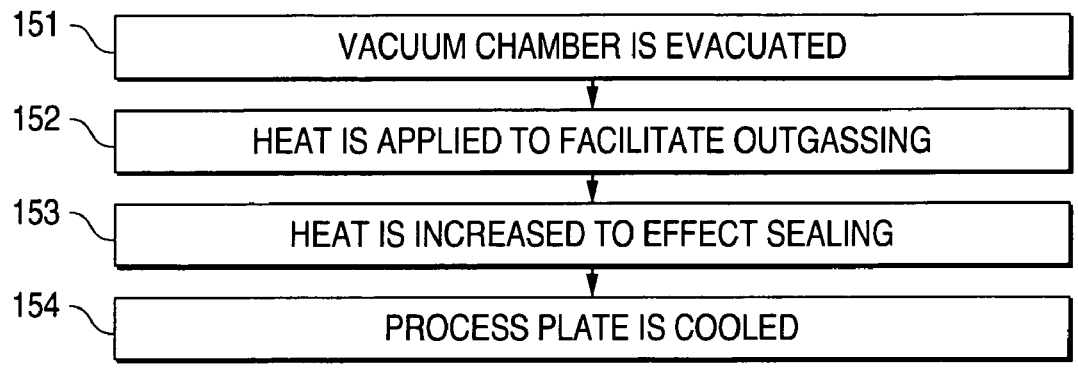
FIG. 15 is a flow chart showing outgassing and sealing of the infrared detector assembly, in accordance with an exemplary embodiment of the present invention.

FIG. 15 is a flow chart showing an exemplary process for outgassing and sealing of the infrared detector assembly. According to this exemplary process, the vacuum chamber is evacuated, as indicated in block 151.

Heat can be applied to the contents of the vacuum chamber, as indicated in block 152. For example, heat can be applied to process block 110. The heat raises the temperature of the components of cells 61, so as to effect outgassing of the components disposed therein. In this manner, gasses and other undesirable substances that may outgas during operation of the infrared detector assembly can substantially be removed. Thus, performance of the infrared detector assembly is enhanced.

During the outgassing process, dimples 17 or other features formed in solder preforms keep window 13 away from upper housing section 12 and keep upper housing section 12 away from lower housing section 11, so as to enhance the ability of gasses to leave unsealed container 20. That is, the dimples 17 or other features maintain cracks between adjacent structures of unsealed container 20 through which gases can escape.

The heat applied at this time is sufficient to effect desired outgassing, but is insufficient to effect sealing. Such heat is applied for a period of time that is effective to provide desired outgassing.

Heat is subsequently increased to effect sealing, as indicated in block 153. That is, the heat is increased from a temperature that is effective to provide outgassing, but not effective to provide sealing, to a temperature that is effective to provide sealing. Thus, solder preforms 14 and 15 melt. Solder preform 14 melts so as to seal lower housing section 11 to upper housing section 12. Similarly, upper solder preform 15 melts so as to seal upper housing section 12 to window 13. Dimples 17 or other features of solder preforms 14 and 15 melt, as well.

Process plate 110 can be cooled, as indicated in block 154. Such cooling can be accomplished by flowing chilled water through manifold 111. Cooling can be accomplished by any other desired method, e.g., thermoelectric coolers (TECs).

The vacuum chamber can be evacuated and/or backfilled with a desired atmosphere that is compatible with operation of the contents of the containers 20 before sealing is performed. Thus, the amount of vacuum (the pressure) and the gasses remaining in the vacuum chamber can be selected such that when the containers 20 are sealed, a desired atmosphere is contained therein.

Figure 16:
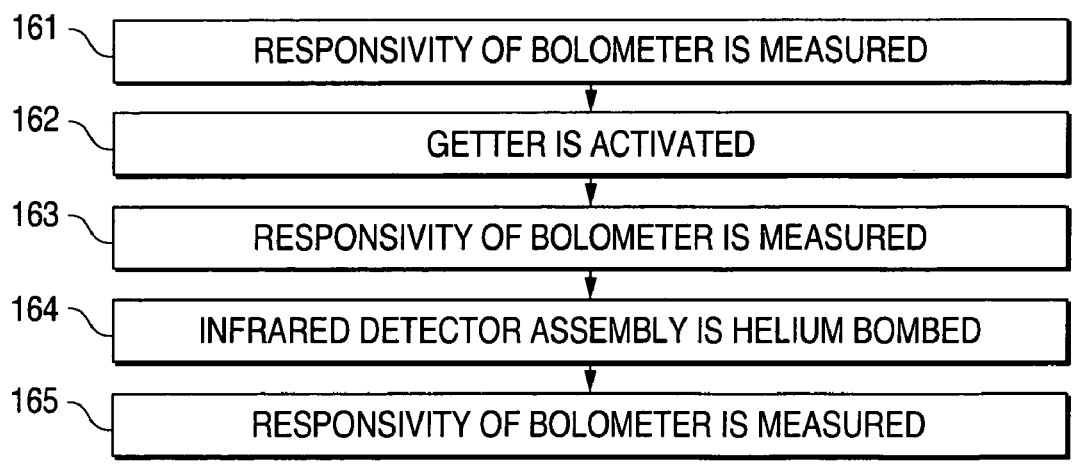
FIG. 16 is a flow chart showing gettering and leak testing of the infrared detector assembly, in accordance with an exemplary embodiment of the present invention.

FIG. 16 is a flow chart showing an exemplary process for gettering and leak testing of the infrared detector assembly. According to this exemplary process, responsivity of at least one bolometer of infrared detector array 21 is measured, as indicated in block 161. This measurement gives some indication of the amount of undesirable gasses remaining within sealed container 20 after it has been sealed.

Responsivity of bolometer(s) can be measured by providing a known amount of radiant energy, e.g., infrared radiation, from a radiant energy source, e.g., a calibrated infrared radiation source. As those skilled in the art will appreciate, responsivity of bolometers depends, at least to some degree, upon the amount of gasses present in sealed container 20. Such gases define a heat path between bolometers and sealed container 20 that affect the response of the bolometers.

Getters 51 are fired or activated, as indicated in block 162. Activation of getters 51 is performed by applying electrical current thereto, such as via electrical leads attached to gold pads formed upon lower housing section 11. Alternatively, getters 51 can be activated by applying current to pins 42. Activation of getters 51 causes at least some gases contained within sealed container 20 to be effectively removed therefrom according to well known principles.

Getters 51 can thus be activated, such as for the first time, after container 20 is sealed. Contemporary practice is to fire getters prior to sealing a container. This is done according to contemporary practice so as to allow gases produced during the gettering process to be removed by the external application of vacuum during and after activating the getters. However, it has been found that the application of vacuum during and after the activation of the getters is not necessary and that the gettering process itself adequately removes gasses produced thereby.

Responsivity of at least one bolometer of each infrared detector assembly 41 can be re-measured, as indicated in block 163. Such re-measuring of the responsivity of at least one bolometer can provide some indication of the effectiveness of the gettering process. That is, such re-measurement of responsivity can determine, to some degree, how much of the gasses present after sealing still remain after activation of getters 51.

Sealed container 20 of infrared detector assembly can be leak checked, such as by bombing it with helium, as indicated in block 164. Helium can be provided in a bombing chamber at a desired pressure, which can be atmospheric pressure, below atmospheric pressure, or above atmospheric pressure. For example, helium bombing can be performed at 60 psi.

Responsivity of bolometer(s) can be once again re-measured, as indicated in block 165. Leakage of helium into sealed container 20 can be indicated by a change in response of bolometers with respect to the previous responsivity measurement.

During outgassing, the vacuum chamber can be pumped down, for example, to $10^{-8}$ to $10^{-6}$ torr. The infrared detector assemblies can then be heated for 2 to 32 hours, e.g. 6 hours, for example, at a temperature below that required for melting solder preforms 14 and 15. The infrared detector assemblies can next be heated rapidly to a temperature suitable for melting solder preforms 14 and 15, but low enough not to jeopardize the reliability of the infrared detector assemblies. The infrared detector assemblies can remain at this elevated temperature for about 3.5 minutes for example for this exemplary implementation in accordance with an embodiment of the present invention. Then the infrared detector assemblies can be rapidly cooled to approximately ambient temperature. A more particular example of a suitable time/temperature profile for outgassing and sealing infrared detector assemblies is provided in Table 1, below.

TABLE 1

| PROCEDURE | TIME | TEMPERATURE | PRESSURE |
|---|---|---|---|
| Outgassing | 6 hours | 171° C. | $5 \times 10^{-6}$ torr |
| Sealing | 3 minutes, 40 seconds | 235° C. | $5 \times 10^{-6}$ torr |
| Cooling | As needed to reach ambient temperature. | ambient | $5 \times 10^{-6}$ torr to ambient |

TABLE 1-continued

| PROCEDURE | TIME | TEMPERATURE | PRESSURE |
|---|---|---|---|
| Leak Checking | 5 days | ambient | 60 psi |

The systems and methods of the present invention are well suited to various automatic manufacturing methodologies. Pick and place equipment can be used to put the infrared detector assembly components into the positioning fixture. Robots or other automated material handling equipment can be used to transport the positioning fixture to and from the vacuum chamber. Automated production/test equipment can be used to perform and monitor outgassing, gettering, and leak testing.

The systems and methods of the present invention provide a low cost and reliable infrared detector assembly. Both material costs and labor costs may be reduced relative to conventional techniques and are suitable for high production volume. The size of the container or housing for the infrared detector assembly may be substantially mitigated and the use of a ceramic base eliminates the need for feed through pins. The use of getters enhances the vacuum within the sealed container, so as to increase both operational quality and longevity.

Embodiments described above illustrate but do not limit the invention. It should also be understood that numerous modifications and variations are possible in accordance with the principles of the present invention. Accordingly, the scope of the invention is defined only by the following claims.

We claim:

1. An unsealed container comprising:
   a first portion of the container;
   a second portion of the container that is configured to seal to the first portion of the container;
   a first solder preform configured to seal the first portion of the container to the second portion of the container upon heating, the first solder preform having at least one feature that is configured to maintain the first portion of the container spaced apart from the second portion of the container so as to enhance outgassing prior to melting the first solder preform; and
   a getter disposed within the unsealed container, wherein the getter is configured to be activated after the container is sealed.

2. The unsealed container of claim 1, wherein the first portion comprises a window.

3. The unsealed container of claim 1, wherein the first portion comprises a lower housing section and the second portion comprises an upper housing section.

4. The unsealed container of claim 1, wherein the feature comprises a dimple.

5. The unsealed container of claim 1, further comprising:
   a window; and
   an infrared sensor array configured to receive infrared radiation through the window.

6. The unsealed container of claim 5, wherein the unsealed container comprises an infrared detector assembly.

7. The unsealed container of claim 5, wherein an electrical path is provided on the first portion and/or the second portion to allow an electrical current to activate the getter after the container is sealed.

8. The unsealed container of claim 7, wherein the unsealed container comprises an infrared detector assembly.

9. The unsealed container of claim 7, wherein the first solder preform comprises a molded solder preform that forms a plurality of complimentary concave and convex surfaces to maintain the first portion of the container spaced apart from the second portion of the container.

10. The unsealed container of claim 1, wherein at least one of the first portion and the second portion comprises a ceramic material having at least one metal trace formed thereon.

11. The unsealed container of claim 1, further comprising a second solder preform configured to seal either the first portion of the container or the second portion of the container to a third portion of the container upon melting the second solder preform, the second solder preform having at least one feature that is configured to maintain the first portion of the container or the second portion of the container spaced apart from the third portion of the container prior to heating so as to enhance outgassing.

12. A method for forming a sealed container, the method comprising:
　placing a first solder preform between a first portion of a container and a second portion of the container, the first solder preform having at least one feature formed therein such that the feature maintains the first portion spaced apart from the second portion in a manner that enhances outgassing prior to melting the first solder preform;
　heating the first solder preform so as to melt the first solder preform and seal the first portion to the second portion in a manner that seals the container; and
　activating a getter disposed within the container after the container is sealed.

13. The method of claim 12, wherein the first portion is a window and the second portion is an upper housing section.

14. The method of claim 12, wherein the first portion is an upper housing section and the second portion is a lower housing section.

15. The method of claim 12, further comprising outgassing the container prior to melting the solder.

16. The method of claim 12, further comprising testing for vacuum degradation using bolometers within the container after the first portion is sealed to the second portion.

17. The method of claim 12, further comprising using at least one bolometer to determine if the sealed container has experienced vacuum degradation by:
　making a first measurement with a bolometer that is within the container;
　applying pressurized gas to the outside of the sealed container;
　making a second measurement with the same bolometer; and
　comparing the first and second measurements.

18. The method of claim 12, wherein placing a first solder preform between a first portion of a container and a second portion of the container comprises using at least one piece of automated equipment to place the first portion, the second portion, and the preform onto a process plate.

19. The method of claim 12, wherein the first portion of the container comprises a lower portion of the container, the second portion of the container comprises an upper portion of the container, and wherein placing a first solder preform between a first portion of a container and a second portion of the container comprises using at least one item of automated equipment to:
　place the first portion of the container upon a process block;
　place the first solder preform upon the first portion of the container;
　place the second portion of the container upon the first solder preform;
　and further comprising:
　using the automated equipment to place a second solder preform upon the second portion of the container; and
　using the automated equipment to place a window upon the second solder preform.

20. An infrared detector assembly produced according to the process of claim 12.

21. The method of claim 12, wherein an electrical path is provided on the first portion and/or the second portion to allow an electrical current to perform the activating of the getter after the container is sealed.

22. An infrared detector assembly produced according to the process of claim 21.

23. The method of claim 21, wherein the first solder preform comprises a molded solder preform that forms a plurality of complimentary concave and convex surfaces to maintain the first portion of the container spaced apart from the second portion of the container.

24. The method of claim 12, further comprising testing the sealed container for leaks, wherein the testing comprises:
　making a first responsivity measurement with a bolometer within the sealed container;
　applying pressurized gas to the outside of the sealed container;
　making a second responsivity measurement with the same bolometer; and
　comparing the first and second responsivity measurements.

25. The method of claim 24, wherein the activating of the getter is performed after the making of the first responsivity measurement and before the making of the second responsivity measurement.

26. The method of claim 25, further comprising:
　making a third responsivity measurement with the same bolometer, wherein the third responsivity measurement is performed after the first responsivity measurement and the activating of the getter but before the applying of the pressurized gas; and
　wherein the comparing further comprises comparing the first and second responsivity measurements with the third responsivity measurement.

27. The method of claim 12, wherein the placing further comprises using at least one item of automated equipment to perform:
　placing a window of the container upon a process block;
　placing an upper solder preform upon the window of the container;
　placing the first portion of the container upon the upper solder preform;
　placing the first solder preform upon the first portion of the container; and
　placing the second portion of the container upon the first solder preform.

28. A method for forming a sealed container, the method comprising:
　placing a first solder preform between a first portion of a container and a second portion of the container;
　placing an infrared detector array and a getter within the container;
　heating the container formed by the first portion and the second portion to a first temperature to perform outgassing of the container;
　heating the container formed by the first portion and the second portion to a second temperature, wherein the second temperature is greater than the first temperature, to melt the first solder preform and seal the first portion to the second portion in a manner that seals the container; and activating the getter disposed within the container after the container is sealed.

29. The method of claim 28, further comprising testing for vacuum degradation based on a responsivity of the infrared detector array within the container after the container is sealed.

30. An infrared detector assembly produced according to the process of claim 28.

31. The method of claim 28, wherein the first solder preform comprises at least one feature formed therein such that the feature maintains the first portion spaced apart from the second portion in a manner that enhances the outgassing of the container prior to melting the first solder preform.

32. The method of claim 28, wherein an electrical path is provided on the first portion and/or the second portion to allow an electrical current to perform the activating of the getter after the container is sealed.

33. The method of claim 28, wherein the first solder preform comprises a molded solder preform that forms a plurality of complimentary concave and convex surfaces to maintain the first portion of the container spaced apart from the second portion of the container.

34. The method of claim 28, further comprising testing the sealed container for leaks, wherein the testing comprises:

making a first responsivity measurement with the infrared detector array within the sealed container;

applying pressurized gas to the outside of the sealed container;

making a second responsivity measurement with the infrared detector array; and comparing the first and second responsivity measurements.

35. The method of claim 34, wherein the activating of the getter is performed after the making of the first responsivity measurement and before the making of the second responsivity measurement.

36. The method of claim 35, further comprising:

making a third responsivity measurement with the infrared detector array, wherein the third responsivity measurement is performed after the first responsivity measurement and the activating of the getter but before the applying of the pressurized gas; and wherein the comparing further comprises comparing the first and second responsivity measurements with the third responsivity measurement.

37. The method of claim 28, wherein the placing of the first solder preform further comprises using at least one item of automated equipment to perform:

placing a window of the container upon a process block;

placing an upper solder preform upon the window of the container;

placing the first portion of the container upon the upper solder preform;

placing the first solder preform upon the first portion of the container; and placing the second portion of the container upon the first solder preform.

38. An infrared detector assembly produced according to the process of claim 37.

* * * * *